United States Patent [19]

Muirhead

[11] Patent Number: 4,605,852

[45] Date of Patent: Aug. 12, 1986

[54] CONDENSATION PREVENTION APPARATUS

[75] Inventor: Allen D. Muirhead, Rossendale, England

[73] Assignee: Unicell Limited, Stockport, England

[21] Appl. No.: 534,189

[22] Filed: Sep. 21, 1983

[30] Foreign Application Priority Data

Sep. 22, 1982 [GB] United Kingdom ............... 8227084

[51] Int. Cl.$^4$ ............................................ G01D 5/34
[52] U.S. Cl. ............................ 250/231 R; 73/336.5; 219/502; 374/19
[58] Field of Search ............... 219/502, 219; 250/238, 250/231 R, 206, 214 R, 214 C; 73/336, 336.5; 374/19

[56] References Cited

U.S. PATENT DOCUMENTS

| | | | |
|---|---|---|---|
| 2,750,546 | 6/1956 | Washburn | 318/28 |
| 2,830,671 | 4/1958 | Robbins | 183/4.1 |
| 3,112,648 | 12/1963 | Dulk et al. | 73/336.5 |
| 3,166,928 | 1/1965 | Jackson et al. | 73/366.5 |
| 3,229,271 | 1/1966 | Frant | 73/366.5 |
| 3,269,185 | 8/1966 | Francisco | 73/336.5 |
| 4,224,565 | 9/1980 | Sosniak et al. | 324/65 R |
| 4,278,870 | 7/1981 | Carleton et al. | 219/502 |
| 4,328,455 | 5/1982 | Harding | 320/1 |

FOREIGN PATENT DOCUMENTS

| | | |
|---|---|---|
| 356635 | 1/1931 | United Kingdom . |
| 371177 | 5/1931 | United Kingdom . |
| 551989 | 9/1941 | United Kingdom . |
| 611730 | 11/1946 | United Kingdom . |
| 1395113 | 3/1973 | United Kingdom . |

*Primary Examiner*—David C. Nelms
*Attorney, Agent, or Firm*—Spensley Horn Jubas & Lubitz

[57] ABSTRACT

Apparatus for preventing the formation of condensation within a cabinet. A light reflective surface is mounted within the cabinet and thermally linked to the exterior of the cabinet so that the reflective surface temperature responds more rapidly to changes in the external ambient temperature than the cabinet itself. The formation of condensation on the reflective surface is detected by monitoring a light beam reflected from the reflective surface. When the formation of condensation on the reflective surface is detected a heater inside the cabinet is turned on to cause the condensation to evaporate.

7 Claims, 2 Drawing Figures

CONDENSATION PREVENTION APPARATUS

The present invention relates to apparatus for preventing the formation of condensation within a cabinet.

As the ambient air temperature falls from a given level so its relative humidity (R.H.) increases until a point may be reached when 100% R.H. is attained. At this stage the air is saturated with moisture and any further reduction in temperature causes this moisture to be deposited as a "dew".

Within an enclosure such as a control gear or instrumentation cabinet this process occurs as the cabinet walls are cooled by external changes such as nightfall, weather change, rainshower etc. In this case moisture is first deposited on the cabinet wall and then may condense directly onto the contents of the enclosure or reach them by dripping from the walls.

Depending on the type of equipment housed, this moisture may pose little or no problem or may have disastrous results. Electrical control gear for example may be rendered vulnerable to tracking between live and earthed or neutral parts through a surface moisture layer. Apart from possible shock danger to personnel a potential fire hazard is also created. D.C. equipment in addition to the aforementioned tracking problem can also cause electrolysis of the water and produce an oxygen and hydrogen gas mixture—a very explosive combination, which would be readily ignited by a spark. Other problems also arise as a result of condensation. These include corrosion of equipment, encouragement of the growth of fungus and algae and the obscurement by misting of inspection doors and instrument dials.

Various techniques are known to reduce or eliminate this type of condensation, the most popular being the use of anti-condensation heaters. These anti-condensation heaters are normally either left on uncontrolled to maintain a temperature differential between internal and external temperatures, or are controlled by an air sensing thermostat.

The former method suffers from the obvious disadvantage that it is wasteful of energy. It is also by no means certain that condensation will never occur. For example, the heater may be sized, as is typical, to maintain a temperature differential of 15° C. Should the external temperature drop to say −10° after a comparatively warm day there is every likelihood that condensation would occur inside a cabinet whose heater could not hold the internal air temperature above 5° C. Another potential problem arises from the fact that the heater will remain on even when temperatures are high. Thus to add 15° C. to an already high temperature of say 40° C. could lead at least to equipment operating outside its calibration range and possibly to dangerous overheating in individual pieces of heat producing equipment.

The latter method of controlling an adequately rated heater by an air sensing thermostat also suffers from a number of drawbacks. For example, it is difficult to accurately judge the temperature that the heater should be set to operate at. Too high a setting would guarantee no condensation but could also cause errors in equipment and reduced life expectancy, whilst too low a setting might not prevent condensation under such adverse conditions as a rainshower or rapid drop in temperature at night after a hot and humid day.

U.S. Pat. No. 4,328,455 describes a dew-point temperature measuring system in which the temperature of a mirror across which a carrier gas is blown is reduced until dew begins to form on the mirror surface as a result of water condensing out of the carrier gas. The mirror temperature is then stabilized to maintain a predetermined density of dew on the mirror. The stable mirror temperature is measured and the measured temperature is the dew point temperature of the carrier gas. The formation of dew on the mirror is detected by directing a beam of light onto the mirror and detecting its reflection. As dew forms the reflected beam is progressively more scattered and accordingly the detector output can be used to control the mirror temperature to maintain a predetermined density of dew on the mirror.

U.S. Pat. No. 2,750,546 describes a similar dew point temperature measuring arrangement in which the density of dew formed on a mirror is measured by detecting a reflected light beam, the mirror temperature again being controlled to stabilize the dew density.

The above described dew point temperature measuring systems which have been known for many years can be used to prevent the formation of condensation in a given area simply by ensuring that the ambient temperature within that area is higher than the dew point temperature. Unfortunately the known systems require means for both heating and cooling the mirror so that the dew point temperature can be attained by the mirror under all possible conditions. In addition, sufficient heat must be supplied to ensure that all the points within the area, including for example cabinet walls exposed to varying ambient conditions, are maintained above the dew point temperature. The known systems are accordingly expensive and waste energy, and for these reasons cannot be used in many applications where condensation within a cabinet is to be avoided.

It is an object of the present invention to provide an apparatus for preventing the formation of condensation within a cabinet which apparatus does not require means for controlling the temperature of a sensing element to detect conditions in which condensation will be formed.

According to the present invention, there is provided an apparatus for preventing the formation of condensation within a cabinet, comprising a radiation source, radiation responsive means producing an output signal corresponding to the amount of radiation incident thereon from the source, a reflective surface positioned so as to refect radiation from the source onto the radiation responsive means, which reflective surface is exposed to the conditions within the cabinet, means for detecting a reduction in the amount of radiation reflected to the radiation responsive means as a result of the formation of condensation on the reflective surface, and means for controlling the conditions within the cabinet to evaporate any detected condensation, the reflective surface being thermally linked to the exterior of the cabinet so that the temperature thereof responds more rapidly to changes in the external ambient temperature than the cabinet itself, whereby the reflective surface is prone to the formation of condensation thereon before the interior of the cabinet and the contents thereof.

The invention takes advantage of the realisation that, providing the temperature of the reflective surface responds more rapidly to ambient temperature changes than the temperature of the inside of the cabinet, for all practical purposes dew will begin to form on the mirror before it forms on the inside of the cabinet or its contents.

Preferably the controlling means comprises a heater which is turned on when condensation is detected on the reflective surface so as to lower the relative humidity within the cabinet.

Preferably the radiation source comprises a light emitting diode (LED) and the radiation responsive means comprises a phototransistor. In such an arrangement the ambient temperature of the LED may be monitored by monitoring the change in the voltage drop across the LED due to its negative temperature coefficient.

The heater may be turned on when the monitored voltage drop indicates that the temperature within the cabinet has dropped to a threshold temperature.

Preferably the reflective surface is connected to a heatsink mounted externally of the cabinet, the reflective surface and the heatsink being thermally insulated from the enclosure.

An embodiment of the present invention will now be described, by way of example, with reference to the accompanying drawings, in which.

Figure 1:
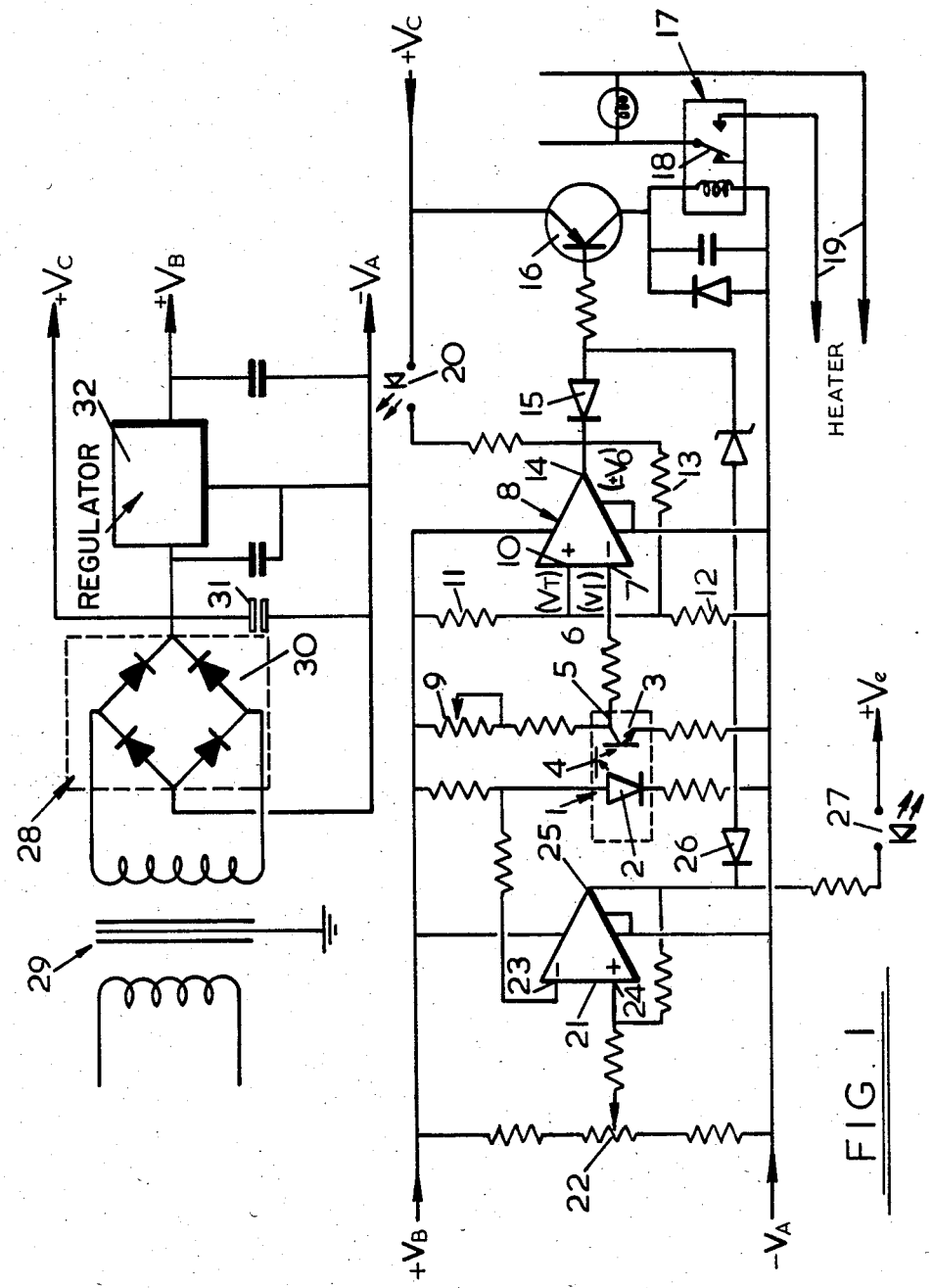
FIG. 1 is a circuit diagram of an embodiment of the present invention.

Referring to FIG. 1 of the accompanying drawings condensation is detected by means of a reflective-opto switch 1, comprising a light emitting diode (LED) 2, a phototransistor 3 and a reflective surface 4, which reflects light from the LED 2 onto the light sensitive base electrode of phototransistor 3.

The reflective surface 4 is mounted in an instrument cabinet in such a way that its temperature is responsive to the external ambient temperature and it therefore cools more rapidly than the cabinet interior. As a result, condensation forms on the reflective surface 4 before it forms on the walls of the cabinet or its contents. Since the collector current of the phototransistor 3 is determined by the amount of light reflected onto the base electrode thereof from the LED 2 by the reflective surface 4, and since the formation of condensation on the reflective surface 4 reduces the amount of light reflected thereby, the formation of condensation on the reflective surface 4 causes a drop in the collector current of phototransistor 3. This change in the collector current of phototransistor 3 can be used to turn on a heater (not shown) within the cabinet to prevent the temperature within the cabinet falling as low as the reflective surface temperature. As the heater warms the cabinet the reflective surface, too, is warmed resulting in the condensation thereon being evaporated. At this point the collector current of phototransistor 3 returns to its original value, as the amount of light reflected by the reflective surface increases, and the heater turns off. This cycle is repeated each time condensation forms on the reflective surface 4.

In order to be able to detect the changes in the collector current of phototransistor 3, resulting from the condensation and evaporation of water on the reflective plate 4, in the embodiment of the present invention shown in FIG. 1 the collector 5 of phototransistor 3 is connected through a resistor 6 to the inverting input 7 of the regenerative comparator or Schmitt trigger 8, and through a variable resistor 9 to the positive supply line. The non-inverting input 10 of comparator 8 is connected by means of resistors 11, 12 and 13 to the positive and negative supply lines and output 14 of comparator 8 respectively, and it is the resistors 12 and 13 which determine the threshold voltage ($V_T$) of the comparator 8. The output 14 of the comparator 8 is connected through a diode 15 to a transistor 16, which, as will be described herebelow switches on and off a relay 17 in its collector circuit according to the level of output 14. The contacts 18 of relay 17 are connected in the power supply line to a heater (not shown) connected across terminals 19.

In order to set up the circuit of FIG. 1 to operate the heater upon the detection of condensation on the reflective surface 4 of switch 1, the voltage on the collector 5 of phototransistor 3 is adjusted to equal the threshold voltage ($V_T$) set on the non-inverting input 10 of comparator 7, when the reflective surface 4 is clear. In consequence of the resistor 6 being connected between collector 5 and inverting input 7 the voltage ($v_1$) on inverting input 7 is somewhat less than the threshold voltage ($V_T$) on non-inverting input 10 when the reflective surface is clear, and as a result comparator output 14 is high ($+V_o$). The high output ($+V_o$) at output 8 reverse-biases diode 15 and, consequently, transistor 16 is held off, ensuring that the heater is not switched on.

When condensation forms on the reflective surface 4 the light reflected onto the phototransistor 3 diminishes, as does the collector current thereof. As a result the voltage on collector 5 and on inverting input 7 rises. When the voltage ($v_1$) on inverting input 7 rises above the threshold voltage ($V_T$) set on non-inverting input 10, the comparator output 14 regeneratively switches to a high negative state ($-V_o$). The high negative output ($-V_o$) at output 14 forward biases diode 15 and as a result current flows in the base circuit of transistor 16 turning it on. In consequence of this current flow in the collector circuit of transistor 16 the contacts 18 of relay 17 close and supply power to the heater (not shown) connected across terminals 19 a bulb 39 indicates energization of the relay 17.

As condensation on the reflective surface 4 is evaporated by the heater, the amount of light reflected from LED 2 onto phototransistor 3 increases resulting in an increase in the collector current. This results in a drop in the voltage on collector 5. When the voltage ($v_1$) on inverting input 7 falls below the threshold ($V_T$) set on non-inverting input 10, the comparator output 14 switches back to a high output ($+V_o$), diode 15 is reversed biased, transistor 16 is turned off and relay contacts 18 open, disconnecting the heater from its power supply.

It will be understood by those skilled in the art that the input voltage at which the comparator output 14 switches to a high negative state ($v_1$ increasing) is different in value from the input voltage at which the comparator output 14 switches to a high positive state ($v_1$ decreasing). This difference results from the hysteresis inherent in the comparator circuit and gives the comparator output 14 a square wave type response to changes in the input signal ($v_1$) on the inverting input 7.

In order to indicate when condensation has occured on the reflective surface 4 an LED 20 is connected between the positive supply line of transistor 16 and the output 14 of comparator 8 so as to be turned on when the comparator output 14 goes negative.

The embodiment of the present invention shown in FIG. 1 also allows for the temperature within the cabinet to be monitored and for the prevention of low temperature therein.

The temperature around the switch 1 is monitored by monitoring the voltage drop across the LED 2. The voltage across the LED 2 has a negative coefficient of for example, $-2$ mV per degree centigrade. By comparing the voltage drop across the LED 2 with a reference voltage corresponding to the voltage drop across the LED 2 for the required threshold temperature, and by having a heater turned on when the two voltages are euqal, it is possible to ensure that the temperatures around the switch 1 never drops much below the required threshold temperature.

In the circuit of FIG. 1 a regenerative comparator 21 is used to compare the reference voltage set by variable resistor 22 and appearing on the inverting input 23 with the actual voltage drop across the LED 2 appearing on the non-inverting input 24. When the temperature of the LED 2 falls to the threshold temperature, the voltage drop across the LED 2 equals the reference voltage set by resistor 22. The output 25 of comparator 21 then changes state from a high positive state $(+V_o)$ to a high negative state $(-V_o)$. The negative voltage at output 25 forward biases a diode 26 connected between output 25 and transistor 16, resulting in transistor 16 being turned on and power being supplied to the heater (not shown) across terminals 19. So as to indicate when the temperature around the switch 1 has dropped to the threshold temperature an LED 27 is connected from the output 25 to the positive supply line of transistor 16 so as to be turned on when output 25 goes negative.

As soon as the temperature around the switch 1 has risen sufficiently the output 25 of comparator 21 switches back to its high positive state $(+V_o)$. This reverse-biases diode 26 and transistor 16 is turned off.

Also shown in FIG. 1 is a power supply 28 for the heater control circuitry described hereinabove. The power supply is conventional, comprising a transformer 29, a bridge rectifier 30, a smoothing capacitor 31 to provide an unregulated supply $(+V_C)$ and a monolithic regulator 32 to provide a regulated supply $(+V_B)$.

Figure 2:
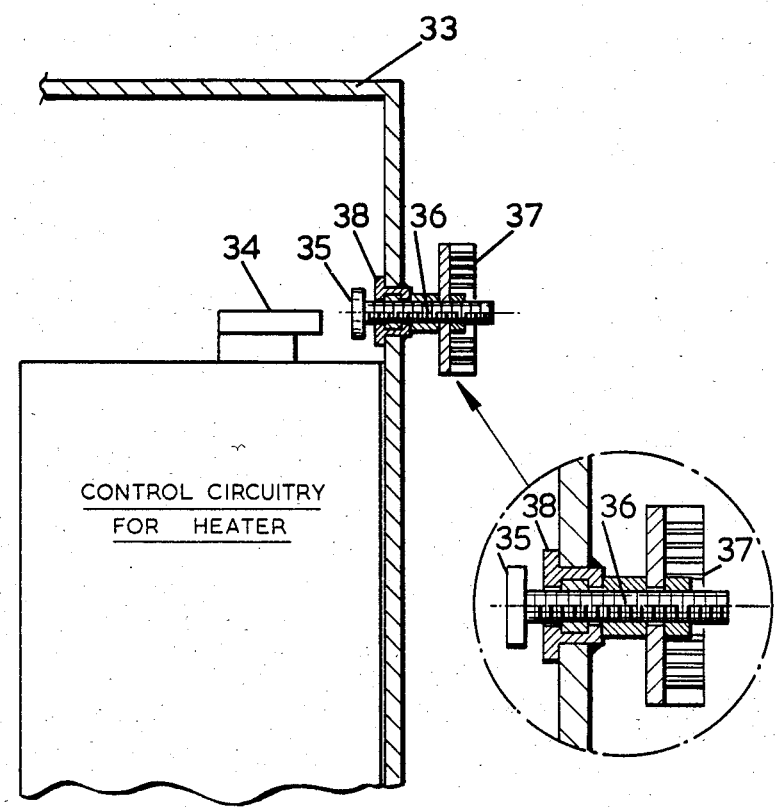
FIG. 2 shows the physical structure of a mirror and heat sink used in an apparatus incorporating the circuit of FIG. 1.

Referring now to FIG. 2 there is shown a portion of a cabinet 33 within which is mounted the circuitry of FIG. 1.

Located within the cabinet 33 is a reflective opto switch of the type described hereinabove. The LED and phototransistor thereof (not shown) are both mounted within an enclosure 34 so as to be positioned opposite a plate 35 the surface of which is reflective. It is by means of the reflective surface of plate 35 that light from the LED is reflected back to the phototransistor.

In order to ensure that the reflective surface of plate 35 responds to changes in the external ambient temperature faster than the cabinet and its contents, the plate 35 is connected by means of a threaded rod 36 through the wall of the cabinet 33 to a heat sink 37. The threaded rod 36 is thermally insulated from the wall of the cabinet 33 through which it passes by a bush 38 and accordingly the temperature of the plate 35 tends to correspond with that of the heat sink 37, which is, of course, the external ambient temperature. It will be appreciated that as a result condensation forms on the reflective surface of the plate 35 when the external ambient temperature falls before it forms on the walls or contents of the cabinet 33.

It will be appreciated that means other than an LED may provide the source of light reflected by the reflective surface, for example, a light bulb; although in such an arrangement it is not possible to monitor the voltage drop thereacross to provide a measure of the ambient temperature.

It will further be appreciated that means other than a phototransistor may provide an output responsive to the amount of light reflected by the reflective surface, for example, a photoresistor or some other photosemiconductor device.

Further it will be appreciated that means other than a regenerative comparator may be used to provide an output to turn on the heater when condensation or low temperatures are detected.

Finally it will be appreciated that a device other than a heater may be used for controlling the formation of condensation within the cabinet. For example a ventilation fan could be provided.

What is claimed is:

1. An apparatus for preventing the formation of condensation within a cabinet, comprising a radiation source, radiation responsive means producing an output signal corresponding to the amount of radiation incident thereon from the source, a reflective surface positioned so as to reflect radiation from the source onto the radiation responsive means, which reflective surface is exposed to the conditions within the cabinet, means connected to an output of the radiation responsive means for detecting a reduction in the output of the radiation responsive means as a result of the formation of condensation on the reflective surface, and means for controlling the conditions within the cabinet to evaporate any detected condensation, the reflective surface being thermally linked to the exterior of the cabinet so that the temperature thereof responds more rapidly to changes in the external ambient temperature than does the interior of the cabinet, whereby the reflective surface is prone to the formation of condensation thereon before the interior of the cabinet and the contents thereof.

2. Apparatus according to claim 1, wherein the controlling means comprises a heater located within the cabinet and connected to the detecting means, the heater being turned on when condensation is detected on the reflective surface.

3. Apparatus according to claim 1, wherein the detecting means comprises means for comparing the output of the radiation responsive means with a threshold signal corresponding to the output of the radiation responsive means when condensation appears on the reflective surface, and means for providing a control output to the controlling means when the output of the light responsive means and the threshold signal are equivalent.

4. Apparatus according to claim 1, wherein the radiation source comprises a light emitting diode (LED) connected to a voltage source and the radiation responsive means comprises a phototransistor.

5. Apparatus according to claim 4, comprising means for monitoring the temperature of the LED by monitoring the change in the voltage drop across the LED due to its negative temperature coefficient, and means for supplying heat to the cabinet when the monitored voltage drop indicates that the temperature within the cabinet has dropped to a threshold temperature.

6. Apparatus according to claim 1, wherein the reflective surface is thermally linked to the exterior of the cabinet by a thermally conductive member which extends through a wall of the cabinet and is thermally connected to a heat sink mounted externally of the cabinet.

7. Apparatus according to claim 6, wherein the thermally conductive member is thermally insulated from the cabinet wall.

* * * * *